(12) United States Patent
Robinson et al.

(10) Patent No.: US 8,395,390 B2
(45) Date of Patent: Mar. 12, 2013

(54) METHOD AND APPARATUS FOR CHARGING A BATTERY

(75) Inventors: Dennis Robinson, Portage, MI (US); Garret Miller, Owatonna, MN (US)

(73) Assignee: SPX Corporation, Charlotte, NC (US)

( * ) Notice: Subject to any disclaimer, the term of this patent is extended or adjusted under 35 U.S.C. 154(b) by 282 days.

(21) Appl. No.: 12/881,583

(22) Filed: Sep. 14, 2010

(65) Prior Publication Data
US 2012/0062237 A1  Mar. 15, 2012

(51) Int. Cl.
G01N 27/416 (2006.01)
H02J 7/00 (2006.01)
H02J 7/04 (2006.01)

(52) U.S. Cl. ........ 324/426; 324/425; 324/429; 324/430; 324/432; 320/132; 320/133; 320/134; 320/136; 320/152

(58) Field of Classification Search .................. 324/426
See application file for complete search history.

(56) References Cited

U.S. PATENT DOCUMENTS

| | | | | |
|---|---|---|---|---|
| 6,144,185 | A * | 11/2000 | Dougherty et al. | 320/132 |
| 7,078,879 | B2 * | 7/2006 | Makhija | 320/133 |
| 2006/0279288 | A1 * | 12/2006 | Klang | 324/426 |

* cited by examiner

*Primary Examiner* — Edward Tso
*Assistant Examiner* — Ahmed Omar
(74) *Attorney, Agent, or Firm* — Baker & Hostetler LLP

(57) ABSTRACT

A method of testing a battery including several steps described herein is provided.

20 Claims, 8 Drawing Sheets

| $V_{bb}$ * 1000 | TESTED CCA |
|---|---|
| 115 | 2000 |
| 127 | 1800 |
| 142 | 1600 |
| 160 | 1400 |
| 180 | 1200 |
| 205 | 1000 |
| 235 | 800 |
| 253 | 700 |
| 275 | 600 |
| 290 | 550 |
| 310 | 500 |
| 334 | 450 |
| 362 | 400 |
| 400 | 350 |
| 446 | 300 |
| 507 | 250 |
| 630 | 200 |
| 799 | 150 |
| 1035 | 100 |
| 1629 | 50 |

*FIG. 6*

MAX CHARGE CURRENT BY BATTERY CAPACITY:

250 - 300 CCA = 30A
200 - 249 CCA = 25A
105 - 199 CCA = 20A

METHOD AND APPARATUS FOR CHARGING A BATTERY

FIELD OF THE INVENTION

The present invention relates generally to a method and apparatus for charging a battery. More particularly, the present invention relates to a battery tester/charger for use on smaller vehicle batteries, such as batteries for all terrain vehicles (ATV's), marine batteries, motorcycle batteries and batteries for ride-on lawnmowers.

BACKGROUND OF THE INVENTION

Battery tester chargers are used to test a battery. Part of conducting a battery test is to load or charge the battery and then measure the voltage of the battery. Previous battery tester chargers may be used in testing and charging batteries used in vehicles such as automobiles. However, previous battery tester chargers may not provide a test tailored for use of smaller batteries used in smaller vehicles, such as motorcycles, ATV's, boats and lawnmowers.

Because some prior existing battery tester chargers use a testing routine designed for larger batteries, testing and charging smaller batteries may result in a battery that is still useful for operations to fail the test and be discarded. Such a situation may result in waste of useful batteries. It may be useful to provide a battery tester charger that provides a testing and charging operation that is more appropriate for smaller batteries.

SUMMARY OF THE INVENTION

The foregoing needs are met, to a great extent, by the present invention, wherein in one aspect an apparatus and method is provided in some embodiments provides a more appropriate testing and charging operation for batteries used in smaller vehicles.

In accordance with another embodiment of the present invention, a method of testing a battery is provided. The method may include: (a) applying a heavy load to the battery, (b) measuring the voltage V1 between the positive and negative terminals of the battery after a first time period under which the battery is subjected to the heavy load; (c) removing the heavy load, (d) waiting for a second length of time, (e) reading the voltage across the positive and negative terminals after the second length of time V2, (f) performing a cold cranking amps CCA test if the CCA test indicates a CCA value above a first threshold, then consider V2, if V2 is below the second threshold than skip to step g but if V2 is above a second threshold than determine if the V2 is above a third threshold, if V2 is above a third threshold than determine that the battery is good and skip steps g-h; but if V2 is below the third threshold then if a battery charge flag has been set, determine that the battery is bad and skip steps g and h, if the battery charge flag has not been recently set determine that the battery is good but needs additional charging and skip steps g-h, if the CCA test indicates a CCA valve below the first threshold then move to step g, (g) determine if the battery charge flag has been set, if the battery charge flag has been set, then determine that the battery is bad, if the battery has not been charged then move to step h; and (h) applying a charging current to the battery if the charging current is less than a fourth threshold amount then stop charging the battery and return to step a, if the charging current is greater than the fourth threshold amount, then charge the battery for a third length of time then stop charging the battery and return to step a.

In accordance with yet another embodiment of the present invention a battery tester charger is provided. The battery tester charger may include: a microcontroller; a data entry device operatively connected to the microcontroller; a display operatively connected to the microcontroller; and a set of terminals configured to connect the microcontroller to a battery, wherein the microcontroller is configured to; (a) applying a heavy load to the battery; (b) measuring the voltage V1 between the positive and negative terminals of the battery after a first time period under which the battery is subjected to the heavy load; (c) removing the heavy load; (d) waiting for a second length of time; (e) reading the voltage across the positive and negative terminals after the second length of time V2; (f) performing a cold cranking amps CCA test if the CCA test indicates a CCA value above a first threshold, then consider V2, if V2 is below the second threshold than skip to step g but if V2 is above a second threshold than determine if the V2 is above a third threshold, if V2 is above a third threshold than determine that the battery is good and skip steps g-h; but if V2 is below the third threshold then if a battery charge flag has been set, determine that the battery is bad and skip steps g and h, if the battery charge flag has not been set determine that the battery is good but needs additional charging and skip steps g-h; if the CCA test indicates a CCA valve below the first threshold then move to step g; (g) determine if the battery charge flag has been set, if the battery charge flag has been set, then determine that the battery is bad, if the battery charge flag has not been set then move to step h; and (h) applying a charging current to the battery if the charging current is less than a fourth threshold amount then stop charging the battery and return to step a, if the charging current is greater than the fourth threshold amount, then charge the battery for a third length of time then stop charging the battery and return to step a.

In accordance with another embodiment of the present invention, a battery tester charger is provided. The battery tester charger may include a means for processing; a means for entering data operatively connected to the means for processing; a means for displaying operatively connected to the means for processing; and means for connecting the means for processing to the battery, wherein the a means for processing is configured to; (a) applying a heavy load to the battery; (b) measuring the voltage V1 between the positive and negative terminals of the battery after a first time period under which the battery is subjected to the heavy load; (c) removing the heavy load; (d) waiting for a second length of time; (e) reading the voltage across the positive and negative terminals after the second length of time V2; (f) performing a cold cranking amps CCA test if the CCA test indicates a CCA value above a first threshold, then consider V2, if V2 is below the second threshold than skip to step g but if V2 is above a second threshold than determine if the V2 is above a third threshold, if V2 is above a third threshold than determine that the battery is good and skip steps g-h; but if V2 is below the third threshold then if a battery charge flag has been set, determine that the battery is bad and skip steps g and h, if the battery charge flag has not been set determine that the battery is good but needs additional charging and skip steps g-h; if the CCA test indicates a CCA valve below the first threshold then move to step g; (g) determine if the battery charge flag has been set, if the battery charge flag has been set, then determine that the battery is bad, if the battery charge flag has not been set then move to step h; and (h) applying a charging current to the battery if the charging current is less than a fourth threshold amount then stop charging the battery and return to step a, if the charging current is greater than the fourth threshold amount, then charge the battery for a third length of time then stop charging the battery and return to step a.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
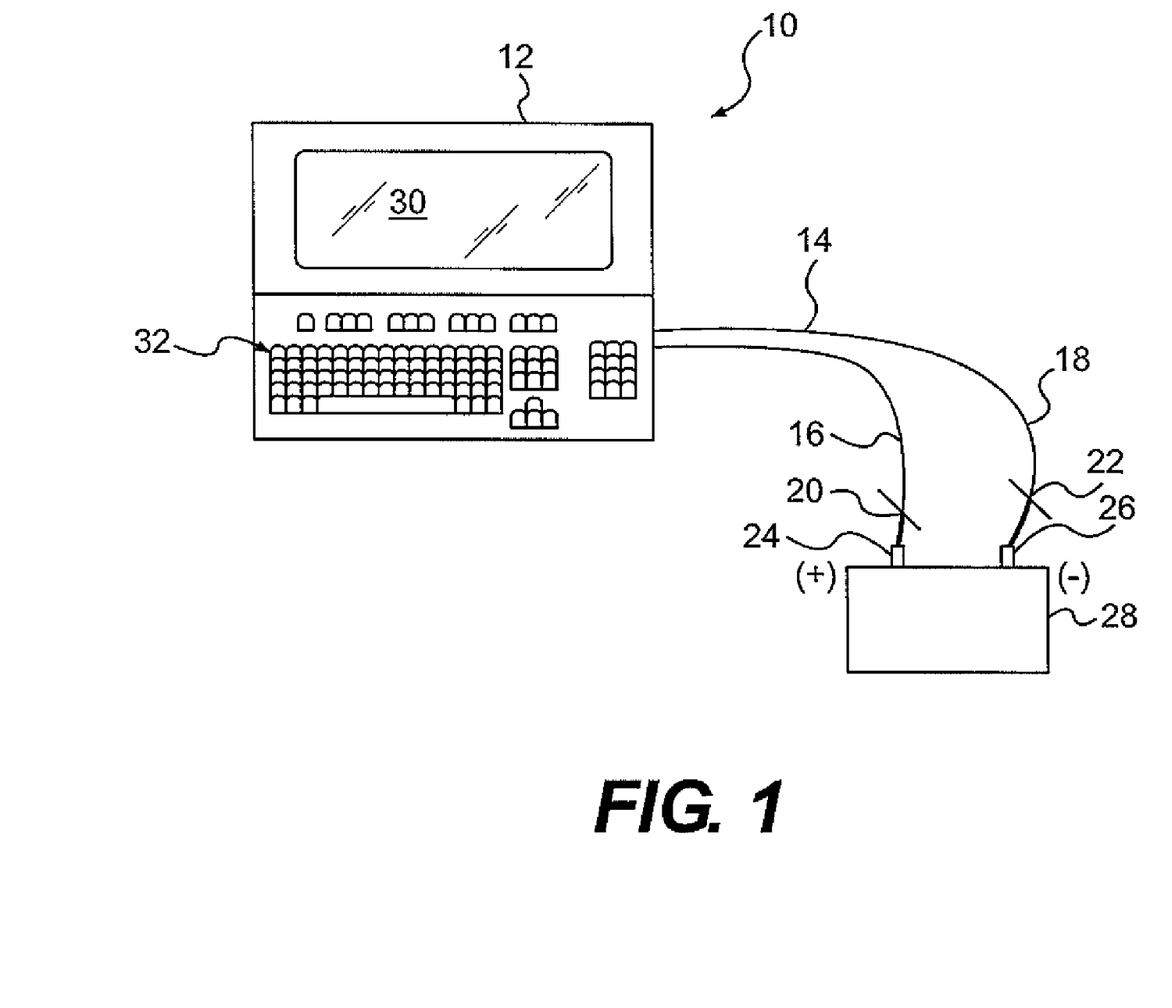
FIG. 1 is a schematic diagram of a battery tester charger attached to a battery in accordance with one embodiment of the invention.

FIG. 1 illustrates a battery tester charger system 10. A battery tester charger system 10 includes a battery tester charger 12 equipped with cables 14. The cables 14 include a positive cable 16 and a negative cable 18. The positive cable 16 has an alligator clamp 20 and the negative cable 18 has an alligator clamp 22. The alligator clamps 20 and 22 have configured to attach to the positive 24 and the negative 26 post on the battery 28. When the alligator clamps 20 and 22 are attached to the posts 24 and 26 then the battery tester charger 12 is operably connected to the battery 28.

The battery tester charger 12 includes a display screen 30 and input device 32. The display screen 30 permits a user to see various conditions of the battery 28 as detected by the battery tester charger 12. In addition, the display screen 30 may also display questions to which the user may input a response via the input device 32. In some embodiments of the invention, the input device 32 may be a keyboard. In other embodiments of the invention, the input device 32 can include any device that can input data into the battery tester charger. For example, a bar code reader could be used as an input device 32, to read a barcode on a battery 28. The input device 32 could also not be a separate feature from the display screen 30 but may be part of the display screen 30 such as a touch screen. The input device 32 may not be a standard keyboard but may be merely various keys having functions when pressed. Any other suitable means for inputting data may be incorporated as part of the input device 32.

The tester charger 12 may be a stand alone tester charger 12 used only for smaller batteries such as those found in motorcycles, ATV's, marine applications and small lawn tractors. In other embodiments the tester charger 12 may be used with a large variety of batteries large and small. For example, the OneStep battery tester charger marketed and sold by the OTC Tool Company maybe modified or made in accordance with embodiments of the invention. The OneStep battery tester charger maybe used to recondition automotive batteries arranging in size from 150 cold cranking amps (CCA) to 1500 CCA.

In some embodiments of the invention, existing battery tester chargers may be reprogrammed to conduct the steps set forth in the flow chart shown in FIGS. 2-5. In other embodiments of the invention existing battery tester chargers are not retrofit but rather are new battery chargers having microprocessors manufactured with software and/or hardware configured to perform the steps described in the flow chart set forth in FIGS. 2-5. In other embodiments the tester charger may include a computer such as a personal computer (pc).

In some embodiments of the invention, the flowchart shown in FIGS. 2-5 is a sub routine used when the battery tester charger is connected to smaller batteries such as batteries rated less than 300 CCA. Other battery testing charging routines may be used for batteries having a larger rating of 300 CCA. Other embodiments of the invention battery tester charger may only contain the routine described in FIGS. 2-5 and batteries having a higher rating than 300 cold cranking amps use a different battery tester charger.

Figure 2:
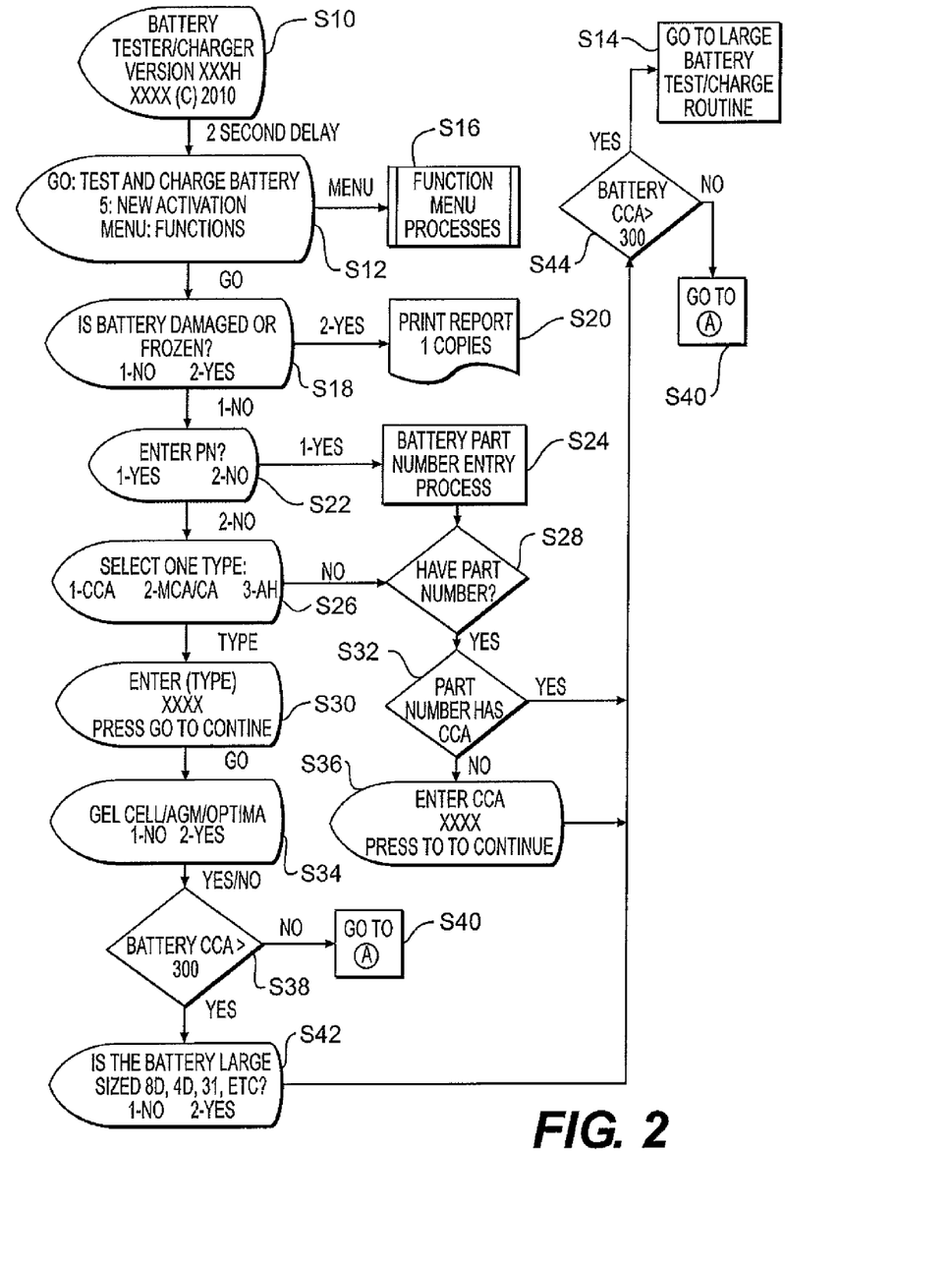
FIGS. 2-5 illustrate a flow chart showing a series of steps that may be accomplished by the battery charger tester in accordance with an embodiment of the invention.

Turning now to FIG. 2, the flow chart describing the steps set forth in FIGS. 2-5 will now be described. In step S10, the battery tester charger 12 is turned on. Optionally the display screen 30 may display a screen showing the manufacturer of the battery tester charger and the version of the battery tester charger routine programmed onto the battery charger 12. After a short delay, such as a two second delay for example, the battery tester charger 12 will move on to step S12.

In step S12 user is presented via the display screen 30 options to go and test and charge a battery or activate different functions or display a menu of functions. If the user requests the menu functions be displayed then at S16, the display screen 30 will display different menu features. If the user selects a "go" option to test and charge a battery, then the battery tester charger 12 will move on to step S18 where user may be asked if the battery 28 is damaged or frozen.

As shown in FIG. 2 and step S18, two numbers 1 and 2 are associated next to the possible responses to the question of whether or not the battery 28 is frozen. For example, number 1 is associated with no and number 2 is associated with yes. Throughout the flow chart, shown in FIGS. 2-5 various numbers may be associated with various responses a user may input. These numbers may be examples of buttons that a user may press to indicate a response. For example, in S18, pressing the button 1 on the input device 32 will indicate to the battery tester charger 12 that the no response is used. In the alternative, pressing the number 2 in the input device 32 the tester charger will take such input as a yes response to the question whether the battery 28 is damaged or frozen. However in other embodiments of the invention the user may simply type in the response or press other numbers or characters which may be associated with the various responses. The example numbers located next to and/or otherwise associated with various responses shown in FIGS. 2-5 is meant to be exemplary only and not limiting to the invention.

In some embodiments of the invention, the battery tester charger 12 may be electronically connected (either wired or wireless) to a printer to prepare and print written reports. In other embodiments in the invention, reports may be sent electronically via email or any other technique for sending electronic messages.

If the user indicates that the battery 28 is frozen or damaged at step S20 the charger 12 will indicate that the battery 28 is frozen and not usable. If the user indicates that the battery 28 is not frozen, then the system may advance to S22 where the user may enter a part number for the battery 28. If the user does indicate that a part number is desired to be entered then at step S24 the part number entry process is initiated. At step S28, the battery tester charger 12 asks the user if the battery 28 has a part number. If it does not, the system moves to S26 where a user may enter what type of battery rating 28 is to be used.

However, if the battery 28 does have a part number, then at step S32 if the part number has a rated CCA or cold cranking amps associated with it as programmed into a memory associated with a micro controller, then the system may automatically advance to step S44. However, if there is no CCA associated with the part number as stored on the tester charger 12 then the user will be prompted to enter the rated CCA associated with the battery 28 or part number.

Once the user has associated the rated CCA associated with the battery 28, then the system will continue to step S44. In some embodiments of the invention the user may need to press go or a similar input in order for the battery tester charger 12 to advance to the next step.

Returning now to step S22, if the user indicated that there was no part number associated with the battery 28 or did not wish to enter one, then the system would advance to step S26. The user would be asked to select-what type of battery 28 rating to be used for the test. Once the rating type had been entered in step S30, then the battery tester charger 12 may ask the user if the battery 28 to be tested and charged is a gel cell battery, an absorbed glass mat (AGM) battery or a spiral wound battery, (such as one commonly identified as an Optima battery).

If the answer to these questions is no, then the system assumes that the battery 28 to be tested is a flooded lead acid battery FLA. Once the user has indicated whether or not the battery is a gel, AGM or spiral wound battery in step S35, at step S38 the system will ask user whether the battery 28 is rated for less than 300 CCA. If the battery 28 is not rated for greater than 300 CCA battery tester charger 12 will move to A at step S40 on FIG. 3.

If the battery is rated at greater than 300 cold cranking amps then the user may be prompted to respond to whether the battery 28 is large sized, for example, 3D, 4D, 31, etc. The user may then be asked at S38 if the battery is rated for greater than 300 CCA's. If the answer is no, then at step S40, the system will move to A on FIG. 3. If the answer is yes, then at step S14 the tester charger 12 will not enter the small battery charging and testing, routine described herein and go to a large battery tester charging routine.

It will be understood that the entry data requested in the routine described in FIG. 2 are optional questions. In some embodiments of the invention, the battery tester charger 12 may sense what type of battery 28 is being tested or charged. In other embodiments of the invention fewer or more questions than those set forth in the steps described in FIG. 2 may be used in accordance with the invention.

Figure 3:
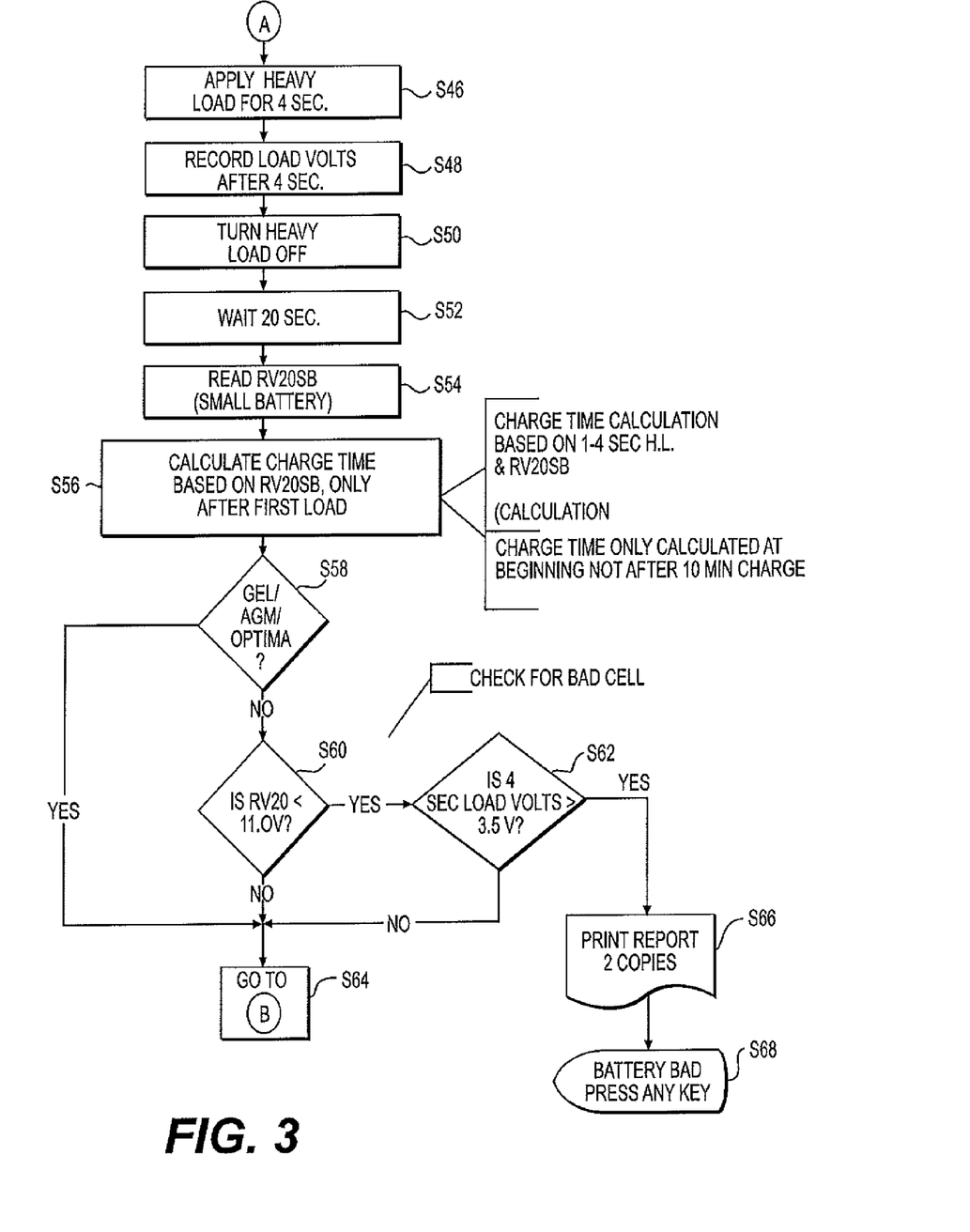

Now turning to FIG. 3 at A, the next step shown is step S46. At S46 a heavy load is applied to the battery 28 for about 4 seconds. In some embodiments of the invention, the heavy load is about 150 amps. At step S48, after applying the heavy load for about 4 seconds, the battery tester charger 12 senses the voltage between the positive 24 and the negative 26 posts. After the load volts have been sensed and recorded by a battery tester charger at step S50 the heavy load is turned off. At step S52, the battery charger tester 12 waits a first period of time for the battery 28 to recover from the heavy load. In some embodiments of the invention, that waiting time may be about 20 seconds.

At step S54 a battery tester charger may then read the voltage between the positive posts 24 and the negative post 26 as a recovery voltage. This recovery voltage is illustrated in FIG. 3 and is referred to as rv20sb meaning recovery voltage at 20 seconds for a small battery. At step S56, the battery tester charger 12 may calculate a charge time based on the recovery voltage.

It will be understood that some embodiments of the invention the steps listed in FIG. 3 may be accomplished more than once as part of the loop during a battery testing charging procedure. However, step S56 in some embodiments of the invention is only accomplished the first time steps shown in FIG. 3 are accomplished during a single battery charging and testing session. In other words, if the steps shown in FIG. 3 are repeated multiple times during a battery charging session, step S56 is accomplished only the first time and omitted in other loops involving the steps shown in FIG. 3.

At step S58, if the battery 28 was inputted back at step S34 to be a gel, AGM or spinal wound battery then the system would move to step S64. However if at step S58, the user did not input that the battery was a gel, AGM or spiral wound battery, then the system would move to step S60 where the system would determine whether the recovery voltage read at step S54 was less than 11 volts. If the recovery voltage was not less than 11 volts, then the system would move to step S64, which is to go to B on FIG. 4. If the recovery voltage as measured in step S54 was less than 11 volts then the system would move to step S62. At step S62 the tester 12 determines if the 4 second load voltage as read at step S48 was greater than 3.5 volts. If it was not, then the system would move to step S64. However, if the 4 second load voltage as recorded in step S48 was greater than 3.5 volts then the system determines the battery to be bad and the system moves to S68 where the display 30 indicates the battery 28 is bad and a printed report at S66 maybe generated indicating that the battery 28 is bad.

As an alternative to printing a report, an electronic report may be sent via email or any other way of transmitting electronic data indicating that the battery 28 is bad. When a printed report is generated as indicated in S66, two copies of the report may be made. One report may be prepared for the customer and one for the technician. Once the battery 28 is determined to be bad, the routine is then stopped. Then at step S68 a user may input data via the input device 32 to start the process over with a new battery or to conduct some other function.

Figure 4:
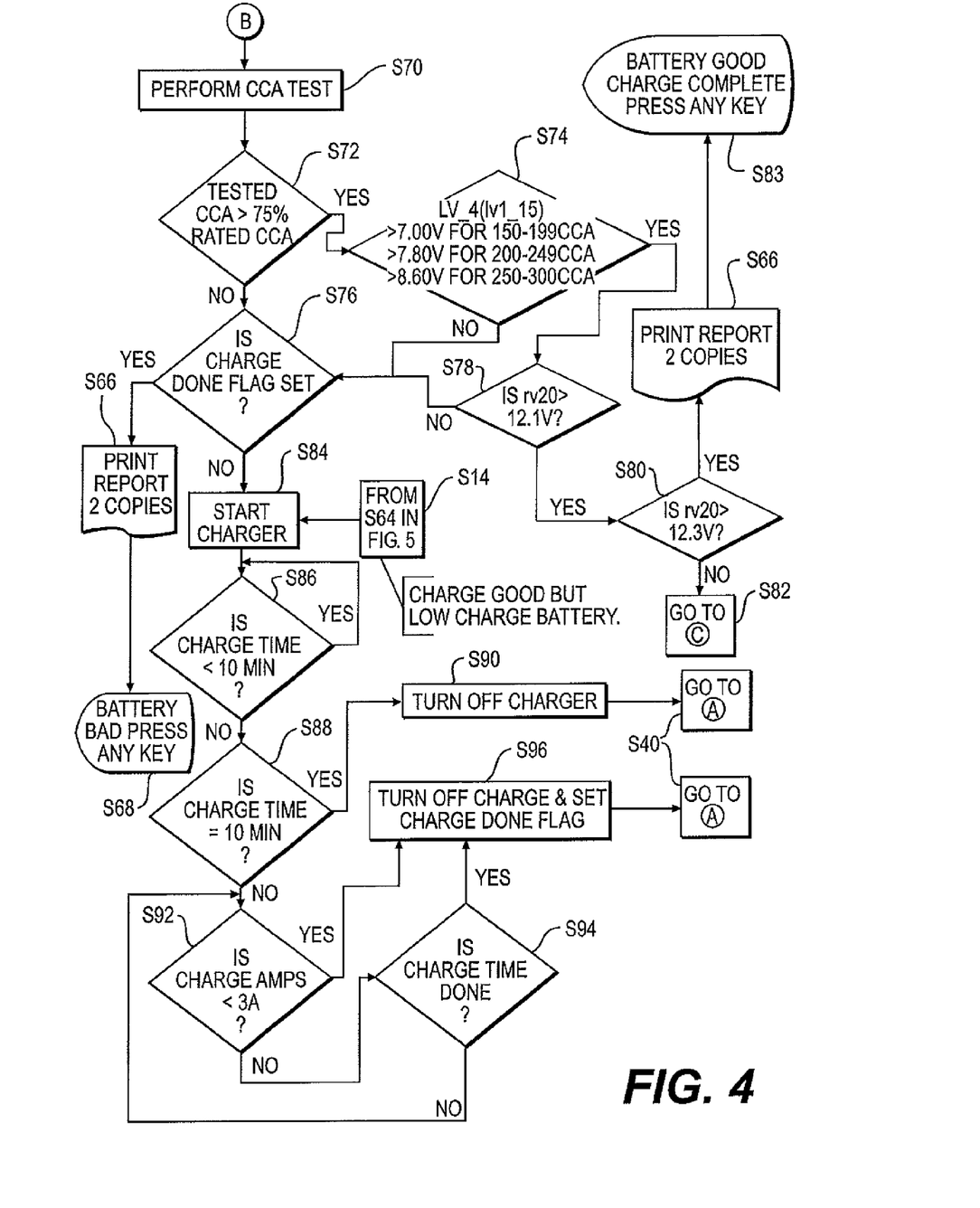
Figure 8:
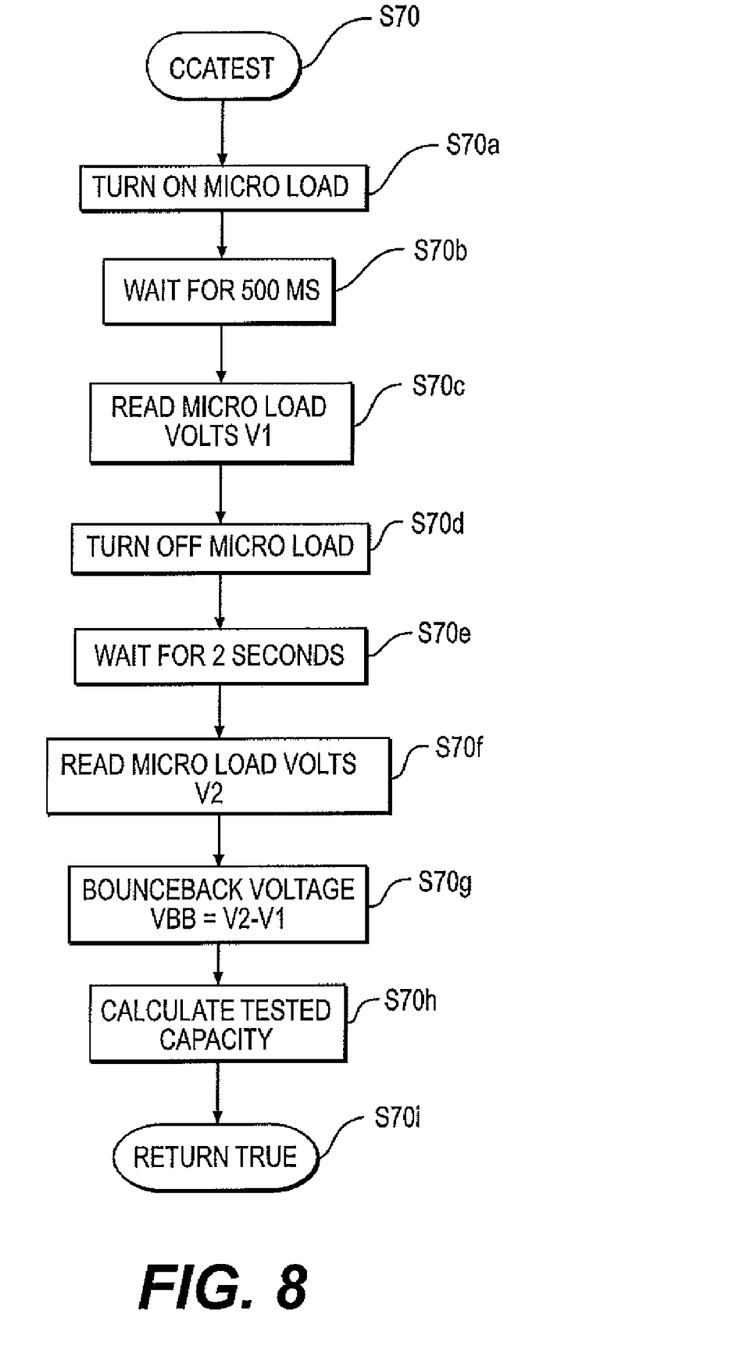
FIG. 8 is a flow chart showing the steps accomplished during a cold cranking amp test.

If the battery 28 is not indicated to be bad, the system moves to part B shown in FIG. 4. As step S70 the system performs a cold cranking amps CCA test at step S70. The CCA test at S70 is shown at FIG. 8. The CCA test at S70 includes turning on a micro load at S70A. The micro load may be 25.2 amps. Other values may also be used. At step S70b the system waits for a period of time, for example, 500 milliseconds. At step S70c the system reads the micro load volts V1. At step S70d the system turns off the micro load and waits for a period of time. As listed in step 70e in some embodiments the invention, the period of time may be about 2 seconds. At step S70f, the system may read the micro load volts V2 which is the voltage of the battery after the waiting period. At step S70g the bounce back voltage may be calculated which is V2 minus V1. In other words, the micro load volts V2 measured after the micro load has been removed minus the micro load voltage when this battery was under a micro load. The bounce back voltage maybe indicated by Vbb in the figures attached. At step S70h, the system may calculate a tested capacity and return that capacity at step S70i.

At step S72, the tested calculated capacity is considered the system makes a determination based on whether the tested calculated capacity determined at step S70h is greater than 75% of the rated cold cranking amps of the battery. S74 shows an example look up table that may be programmed or saved into the battery tester charger 12 to make this determination. For example, in an example embodiment if the tested and calculated CCA is greater than 7 volts for a battery rated for a 150-199 CCA the testing CCA will be greater than 75% of the rating CCA. If the tested or measured CCA is greater than 7.8 volts for a 200-249 rated CCA battery, the tested or measured CCA will be greater than 75% of the rated CCA. If the measured tested CCA is greater than 8.6 volts for a 250-300 CCA rated battery then the tested or measured CCA will be greater then 75% of the rated CCA.

If the tested CCA is greater than 75% of the rated cold cranking amps then the system, moves to step S78 where the recovery voltage calculated at step S54 is compared against a threshold amount of 12.1 volts. If the recovery voltage is less than 12.1 volts then the system moves to step S76. However, if the recovery voltage is greater than 12.1 volts the system moves to S80 and a second threshold value is compared against the recovery voltage. If the recovery voltage is greater than 12.3 volts then it is determined that the battery is good at step S83 and a printed report may be generated at step S66. Again the report may be printed electronically or on paper and multiple copies of the report may be generated.

Figure 5:
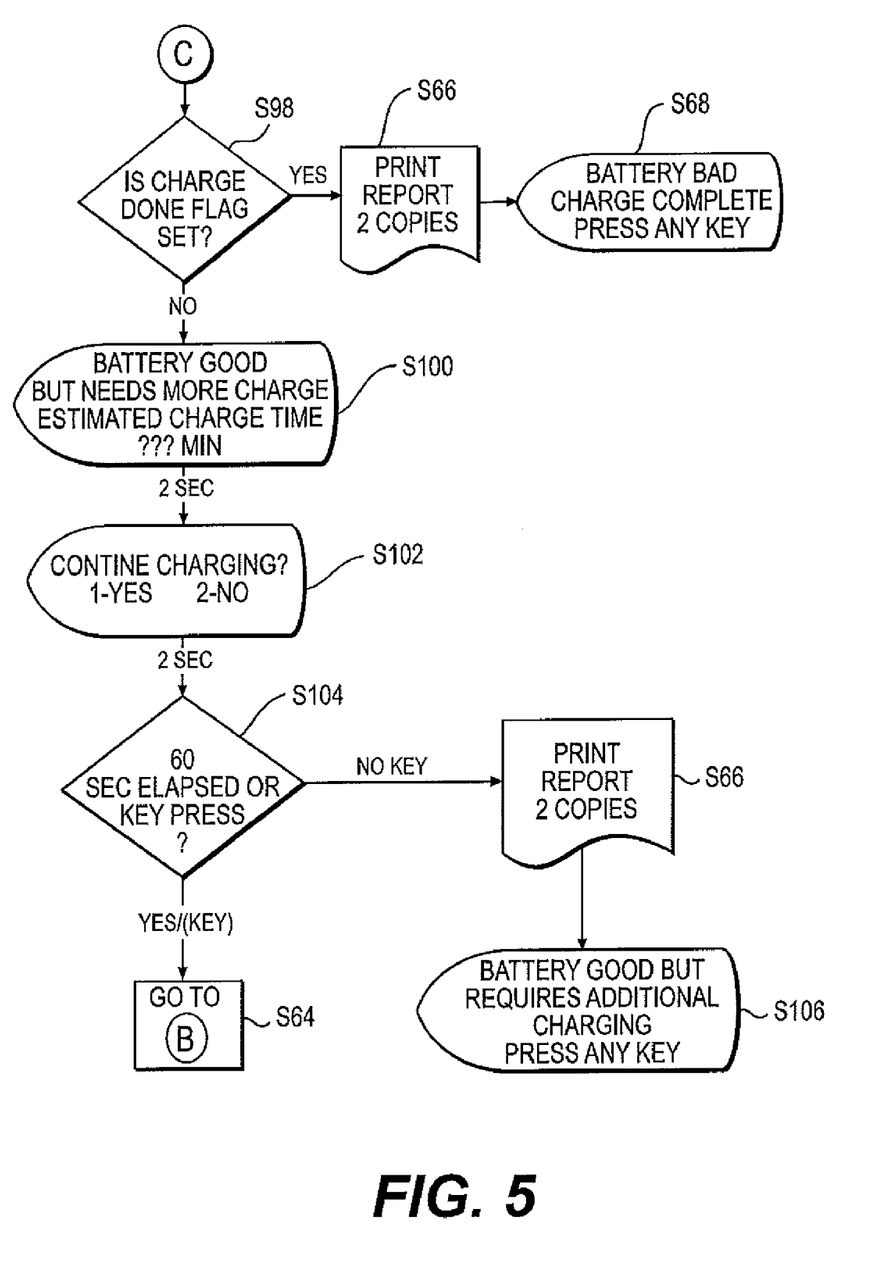

However, if the recovery voltage is not greater than 12.3 volts then the system may move to part C shown in FIG. 5 as illustrated in step S82.

Returning to step S78, if the voltage is not greater than 12.1 volts then the system returns to step S76. In addition, at step S72 if the tested CCA is not greater than 75% of the rated cold cranking amp then the system also moves to step S76. At step S76 the system determines whether or not a battery 28 charge flag has been set. In some embodiments, a charge flag or other marker is set to indicate that the battery 28 has been charged during the current test/charge procedure. If the charge flag has been set (indicating the battery 28 was charged during the test charge cycle) then at step S68, the system will display that the battery 28 is bad and print reports or generate electronic reports at step S66. However, if at step S76 it is determined that that no charge flag has been set, then at step S84, the battery tester charger 12 will start to charge the battery 28.

In some embodiments where the method shown as the steps illustrated in FIGS. 2-5 is incorporated into a tester charger 12 that also tests and charges large batteries.

As shown in step S84 the test recharger 12 starts to charge the battery 28. As indicated in step S86, if the charge time is less than 10 minutes then the charging routine will continue. Once the charge time reaches 10 minutes as indicated in step S88 then as indicated in step S90 and S94, the charging function will be turned off.

At that point, the charger tester 12 will go to A on FIG. 3 as indicated in S40. However, returning to step S86, while the charge time is less than 10 minutes the tester charger 12 will not be monitoring the charge amps in step S92. If the charge time is greater than 10 minutes, and if the charge amps are less than a certain threshold, for example three amps, then as indicated in step S96 the charger tester 12 will turn off the charge and set the charge done flag in step S96. However, if the charging amps do exceed the threshold and the charge time is not complete then the charging will continue as indicated in steps S92 and S94.

Once the charge time is completed as indicated in step S88 or in S94 then as indicated in step S90 and S94 the charge will turned off and the charge flag will be set. The battery tester charger will move to A in FIG. 3 as indicated in step S40.

Turning to step S82, when the system moves to C as indicated in FIG. 5 to step S98. The charger tester 12 in step S98 determines whether the battery 28 has been set. If the battery 28 charge flag has been set as indicated then at S68 the tester charger 12 will display the battery 28 is bad and will print a report accordingly as indicated in S66.

However, if it is determined that the battery 28 charge flag is not set in step S98 then the battery tester charger 12 will determine at step S100 that the battery 28 is good but needs more charge.

Figure 9:
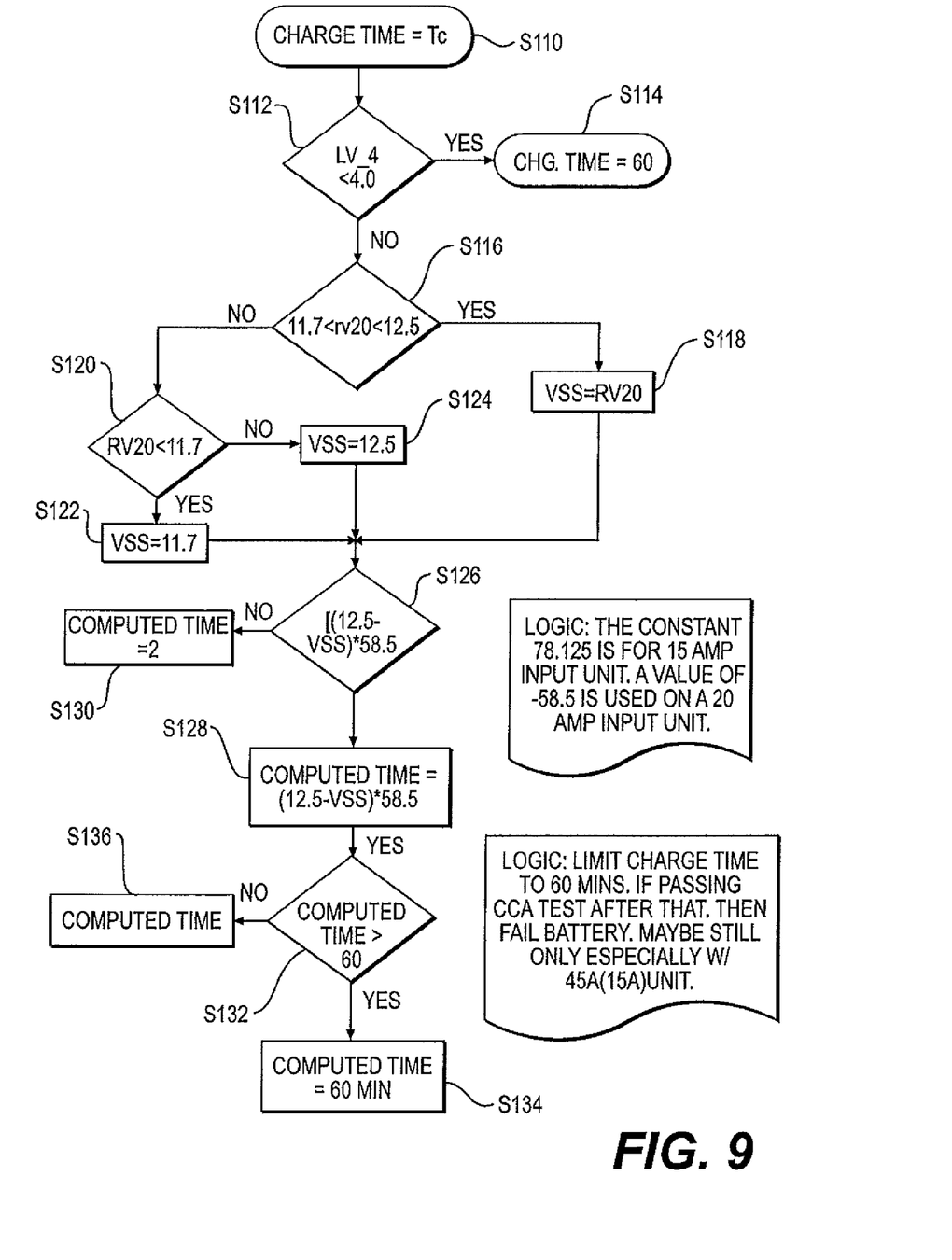
FIG. 9 is a flow chart showing the steps accomplished when calculating a charge time.

Depending upon the value for the recovery voltage, an estimated charge time will be calculated in step S56. FIG. 9 shows a listing of example steps that may be taken to calculated an estimated charge time. Starting in S110 the charge time is considered to be Tc. In S112, the battery voltage (shown in FIG. 9 as Iv_4) is compared. If Iv_4 is less than 4 volts, that in S114 the charge time will be calculated to be 60 minutes. If Iv_4 is not less than 4 volts, than in S116 rv20 is compared with 11.7 and 12.5 volts. If rv20 is greater than 11.7 and less than 12.5 volts, than at step 118, the valve for Vss is assigned the valve of rv20.

However, if rv20 is not greater than 11.7 and less than 12.5 volts, than at S120 rv20 is compared to determine if rv20 is less than 11.7 volts. If rv20 less than 11.7 volts than the valve for Vss is assigned 11.7. If rv20 is not less than 11.7 volts than in S124, the value for Vss is assigned the value of 12.5. Once a value for Vss is assigned in either steps S118, S122 or S124, in S126 the assigned value for Vss is subtracted from 12.5 and that number is multiplied by 58.5 for a 20 amp input unit or the number is multiplied by 78.125 for a 15 amp unit.

The number arrived at in S126 is compared to 60 in S132. If the number from S128 is greater than 60 then in S134 the estimated charge time is 60 minutes. If the number from S128 is less than 60 than in S136 the charge time is number arrived at in S128 in minutes.

Returning now to FIG. 5, in step S100 the display screen 30 may indicate to a user that the battery 28 is good but the battery 28 needs more charging and may indicate an estimated charge time. Estimating the amount of time it will take to charge the battery in S100 may be accomplished by using the calculation arrived at in S56. After the remaining charge time has been displayed on the screen 30 for a period of time (for example perhaps 2 seconds), then the battery tester charger 12 will request that the user indicate whether the user wishes more charging to occur in step S102.

As indicated in step S104, if a certain time period elapses (for example 60 seconds) and the user has not responded, then charging will occur automatically. As indicated in Step S104, if the user does not want to continue, a report will be generated that the battery 28 is good but more charging is needed in step S66. If a user determines that they do wish to continue to charge the battery 28 then the system will go to part B on FIG. 4 as indicated in step S64 in FIG. 5.

Figure 7:
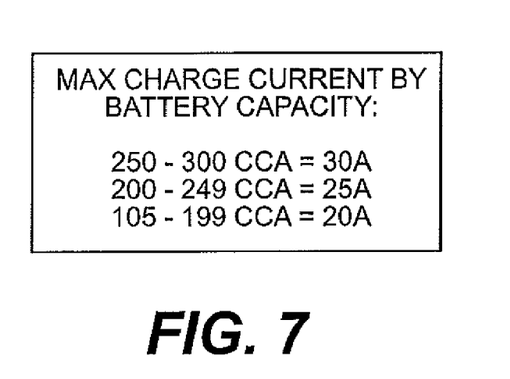
FIG. 7 is a table illustrating a maximum charge current by battery to capacity.

FIG. 7 indicates a maximum charge current that may be used depending on the rated CCA in the battery. For example, if a battery is rated between 250 and 300 CCA then a maximum of 30 amps would be used to change the battery. If the rated CCA is between 200 and 249 then the maximum charging current will be 25 amps. If the rated CCA is between 150 and 199 then the maximum charge current will be 20 amps.

Figure 6:
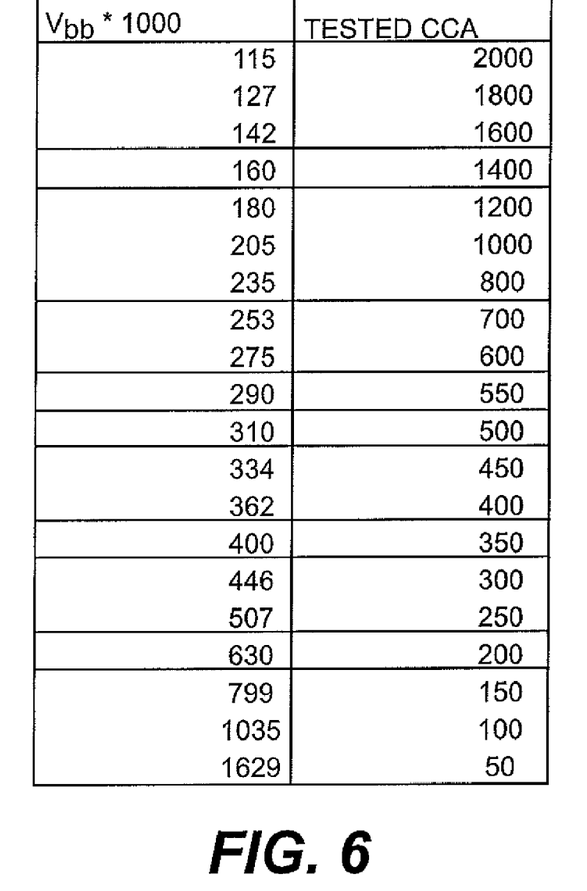
FIG. 6 illustrates a table showing a bounce back voltage corresponding to a cold cranking amps value.

FIG. 6 is a chart indicating a bounce back voltage (Vbb) times 100 value having a corresponded tested CCA value. The charger tester 12 may have a look up table stored in its memory to search for a CCA corresponding to a Vbb once the Vbb is determined a corresponding CCA and be returned via the look up table and used during the CCA test at step S70. For values in between values shown on the table of FIG. 6 a CCA may be interpolated from the table.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method of testing a battery comprising:
   (a) applying a heavy load to the battery;
   (b) measuring the voltage V1 between the positive and negative terminals of the battery after a first time period under which the battery is subjected to the heavy load;
   (c) removing the heavy load;
   (d) waiting for a second length of time;
   (e) reading the voltage across the positive and negative terminals after the second length of time V2;
   (f) performing a cold cranking amps CCA test
      if the CCA test indicates a CCA value above a first threshold, then consider V2, if V2 is below the second threshold than skip to step g but if V2 is above a second threshold than determine if the V2 is above a third threshold, if V2 is above a third threshold than determine that the battery is good and skip steps g-h; but if V2 is below the third threshold then if a battery charge flag has been set, determine that the battery is bad and skip steps g and h, if the battery charge flag has not been set, determine that the battery is good but needs additional charging and skip steps g-h;
      if the CCA test indicates a CCA valve below the first threshold then move to step g;
   (g) determine if the battery charge flag has been set,
      if the battery charge flag has been set, then determine that the battery is bad,
      if the battery charge flag has not been set then move to step h; and
   (h) applying a charging current to the battery
      if the charging current is less than a fourth threshold amount then stop charging the battery and return to step a,
      if the charging current is greater than the fourth threshold amount, then charge the battery for a third length of time then stop charging the battery and return to step a.

2. The method of claim 1, wherein the first threshold amount is about 75% of the rated CCA.

3. The method of claim 2, wherein the first threshold about is about 7 volts for batteries rated between 150 and 199 CCA; about 7.8 Volts for batteries rated between 200 and 249 CCA; and about 8.6 Volts for batteries rated between 250 and 300 CCA.

4. The method of claim 1, wherein the second threshold amount is about 12.1 Volts 5. The method of claim 1, wherein the third threshold amount is about 12.3 Volts.

6. The method of claim 1, wherein the fourth threshold amount is about 3 Amps.

7. The method of claim 1, wherein the heavy load is about 150 Amps.

8. The method of claim 1, wherein the first length of time is about 4 seconds.

9. The method of claim 1, wherein the second length of time about 20 seconds.

10. The method of claim 1, wherein the third length of time is about 10 minutes.

11. The method of claim 1, wherein the CCA test includes applying a micro load to a battery, waiting for 500 ms, read the micro load volts mV1; turn off the micro load, wait for about 2 seconds, read micro load volts mV2, calculate a bounce back voltage Vbb as Vbb=mV2−mV1 and correlate the Vbb with a tested CCA as listed in or interpolated from the following values: and return the tested CCA for Vbb*1000=400 the tested CCA is 350; for Vbb*1000=446 the tested CCA is 300; for Vbb*1000=507 the tested CCA is 250; for Vbb*1000=630 the tested CCA is 200; for Vbb*1000=799 the tested CCA is 150; for Vbb*1000=1035 the tested CCA is 100; for Vbb*1000=1629 the tested CCA is 50.

12. The method of claim 1, if V2 is less than 11 volts, then applying a 4 second load if the voltage after applying the four second load is greater than 3.5 volts than determine that the battery is bad.

13. The method of claim 1, further comprising calculating a charge time after measuring V2.

14. The method of claim 13, wherein the charge time is limited to no more than 60 minutes.

15. The method of claim 1, further comprising printing a report after determining that the battery is good or bad.

16. The method of claim 1 further comprising entering data regarding the battery into a battery tester.

17. A battery tester charger comprising:
   a microcontroller;
   a data entry device operatively connected to the microcontroller;
   a display operatively connected to the microcontroller; and
   a set of terminals configured to connect the microcontroller to a battery,
   wherein the microcontroller is configured to;
   (a) applying a heavy load to the battery;
   (b) measuring the voltage V1 between the positive and negative terminals of the battery after a first time period under which the battery is subjected to the heavy load;
   (c) removing the heavy load;
   (d) waiting for a second length of time;
   (e) reading the voltage across the positive and negative terminals after the second length of time V2;
   (f) performing a cold cranking amps CCA test
      if the CCA test indicates a CCA value above a first threshold, then consider V2, if V2 is below the second threshold than skip to step g but if V2 is above a second threshold than determine if the V2 is above a third threshold, if V2 is above a third threshold than determine that the battery is good and skip steps g-h; but if V2 is below the third threshold then if a battery charge flag has been set, determine that the battery is bad and skip steps g and h, if the battery charge flag has not been set, determine that the battery is good but needs additional charging and skip steps g-h;

if the CCA test indicates a CCA valve below the first threshold then move to step g;

(g) determine if the battery charge flag has been set, if the battery charge flag has been set, then determine that the battery is bad, if the battery charge flag has not been set, then move to step h; and (h) applying a charging current to the battery if the charging current is less than a fourth threshold amount then stop charging the battery and return to step a, if the charging current is greater than the fourth threshold amount, then charge the battery for a third length of time then stop charging the battery and return to step a.

18. The method of claim 17, wherein the first threshold amount is about 75% of the rated CCA, the second threshold amount is about 12.1 Volts, the third threshold amount is about 12.3 Volts, and the fourth threshold amount is about 3 Amps.

19. The method of claim 1, wherein the first length of time is about 4 seconds, the second length of time about 20 seconds, the third length of time is about 10 minutes.

20. A battery tester charger comprising:
a means for processing;
a means for entering data operatively connected to the means for processing;
a means for displaying operatively connected to the means for processing; and
means for connecting the means for processing to the battery,
wherein the means for processing is configured to;
(a) applying a heavy load to the battery;
(b) measuring the voltage V1 between the positive and negative terminals of the battery after a first time period under which the battery is subjected to the heavy load;
(c) removing the heavy load;
(d) waiting for a second length of time;
(e) reading the voltage across the positive and negative terminals after the second length of time V2;
(f) performing a cold cranking amps CCA test if the CCA test indicates a CCA value above a first threshold, then consider V2, if V2 is below the second threshold than skip to step g but if V2 is above a second threshold than determine if the V2 is above a third threshold, if V2 is above a third threshold than determine that the battery is good and skip steps g-h; but if V2 is below the third threshold then if a battery charge flag has been set, determine that the battery is bad and skip steps g and h, if the battery charge flag has not been set, determine that the battery is good but needs additional charging and skip steps g-h;

if the CCA test indicates a CCA valve below the first threshold then move to step g;

(g) determine if the battery charge flag has been set, if the battery charge flag has been set, then determine that the battery is bad, if the battery charge flag has not been set, then move to step h; and (h) applying a charging current to the battery if the charging current is less than a fourth threshold amount then stop charging the battery and return to step a, if the charging current is greater than the fourth threshold amount, then charge the battery for a third length of time then stop charging the battery and return to step a.

* * * * *